United States Patent
Han et al.

(10) Patent No.: US 7,126,083 B2
(45) Date of Patent: Oct. 24, 2006

(54) CHIP SCALE MARKER AND METHOD OF CALIBRATING MARKING POSITION

(75) Inventors: You Hie Han, Daejeon (KR); Chang Su Jun, Seoul (KR)

(73) Assignee: EO Technics Co., Ltd., Anyang (KR)

( * ) Notice: Subject to any disclaimer, the term of this patent is extended or adjusted under 35 U.S.C. 154(b) by 150 days.

(21) Appl. No.: 10/887,914

(22) Filed: Jul. 12, 2004

(65) Prior Publication Data

US 2004/0256368 A1 Dec. 23, 2004

Related U.S. Application Data

(62) Division of application No. 10/615,901, filed on Jul. 10, 2003, now Pat. No. 6,794,205.

(30) Foreign Application Priority Data

Dec. 24, 2002 (KR) ............ 10-2002-0083202

(51) Int. Cl.
   *H01L 21/263* (2006.01)
   *H01L 21/302* (2006.01)
   *H01L 21/461* (2006.01)

(52) U.S. Cl. .................... 219/121.69; 219/121.68; 438/15

(58) Field of Classification Search ........ 219/121.68, 219/121.69, 121.82, 121.83; 250/491.1; 33/286; 356/243.4, 243.5; 438/15; 396/311, 396/401

See application file for complete search history.

(56) References Cited

U.S. PATENT DOCUMENTS

| | | | |
|---|---|---|---|
| 5,085,502 A * | 2/1992 | Womack et al. ............ 356/605 |
| 5,493,403 A | 2/1996 | Nishi | |
| 5,524,131 A * | 6/1996 | Uzawa et al. .................. 378/34 |
| 5,837,962 A * | 11/1998 | Overbeck ............... 219/121.68 |
| 5,886,319 A * | 3/1999 | Preston et al. ......... 219/121.72 |
| 5,898,491 A * | 4/1999 | Ishiguro et al. .......... 356/243.4 |
| 6,240,258 B1 | 5/2001 | Yoshikawa | |
| 6,589,801 B1 | 7/2003 | Yoon et al. | |
| 6,710,286 B1 | 3/2004 | Han | |

FOREIGN PATENT DOCUMENTS

| | | | | |
|---|---|---|---|---|
| JP | 357092879 A | * | 6/1982 |
| JP | 363066446 A | * | 3/1988 |
| JP | 402240505 A | * | 9/1990 |
| JP | 09-248692 | | 9/1997 |

* cited by examiner

*Primary Examiner*—Samuel M. Heinrich
(74) *Attorney, Agent, or Firm*—Buchanan Ingersoll & Rooney PC

(57) ABSTRACT

A chip scale marker including a laser system, a wafer holder supporting a wafer to be processed, and a camera moving above the wafer holder by being connected to an X-Y stage and monitoring the wafer supported on a center hole of the wafer holder, the chip scale marker includes a unit detachably arranged on a laser beam path from the laser system and reducing power density of a laser beam, and a screen arranged on a center hole of the wafer holder and indicating a position where a laser beam from the laser system is irradiated.

15 Claims, 9 Drawing Sheets

LASER BEAM

LASER BEAM

CHIP SCALE MARKER AND METHOD OF CALIBRATING MARKING POSITION

BACKGROUND OF THE INVENTION

This application claims the priority of Korean Patent Application No. 2002-83202 filed Dec. 24, 2002 in the Korean Intellectual Property Office, the disclosure of which is incorporated herein in its entirety by reference.

1. Field of the Invention

The present invention relates to an apparatus and method of calibrating the marking position of a chip scale marker, and more particularly, to an apparatus and method of calibrating the marking position of a chip scale marker which marks a character on a wafer chip using a laser beam.

2. Description of the Related Art

Several thousands or tens of thousands of chips are formed on a wafer used in a semiconductor process. To classify the chips according to production lots, characters and/or numbers are marked on a surface of each chip. A chip scale marker using a laser beam is used as an equipment for marking.

FIG. 1 is a view illustrating a constitution of a typical chip scale marker. FIG. 2 is a view illustrating a constitution of the laser system of FIG. 1.

Referring to FIGS. 1 and 2, a wafer w is placed on a wafer holder 20 and a laser system 30 is arranged under the wafer holder 20. A laser beam oscillated by a laser oscillator 31 of the laser system 30 is magnified by a beam expander 32 and input to a Galvano scanner 33. The laser beam input to the Galvano scanner 33 is irradiated onto chips on the wafer w through an f-θ lens 34 so that characters are recorded on a surface of the chips. The above laser system is disclosed in Japanese Patent Publication No. H9-248692.

A camera 40 monitoring the wafer w being supported by the wafer holder 20 is arranged above the wafer holder 20. The camera 40 is moved by being connected to an X-Y stage 50.

FIG. 3 is a view illustrating that a marking shape is distorted by the Galvano scanner. The Galvano scanner 33 includes an x mirror 33a and a y mirror 33b. The x mirror 33a controls movement of a laser beam in a direction x by an x drive (not shown) rotating a shaft 33c at one end of the x mirror 33a. The y mirror 33b controls movement of a laser beam output from the x mirror 33a in a direction y by a y drive (not shown) rotating a shaft 33d at one end of the y mirror 33b. Thus, an optical path in the direction x is longer than that in the direction y. Accordingly, when a signal to mark a rectangular shape as shown in FIG. 4A is transmitted, a distortion like a pin cushion as shown in FIG. 4B is generated. Also, a positional error is generated due to a tiny difference in position between center lines of rotation shafts 33c and 33d of the x and y mirrors 33a and 33b and surfaces of the x and y mirrors 33a and 33b.

In the meantime, as the beam having passed through the Galvano scanner 33 passes through the f-θ lens 34, the beam is curved so that a barrel distortion is generated. To improve the distortion phenomenon of the marking, marking calibration should be periodically performed to control the rotation of the x and y mirrors 33a and 33b of the Galvano scanner 33.

FIG. 5 is a view illustrating a conventional method of measuring a marking error. According to the conventional method, a laser beam is irradiated onto a plate 70 having a shape and size corresponding to a wafer and a plurality of small holes 70a having a diameter of 0.3 mm formed in the plate 70 at a predetermined interval, and the position of the laser beam passing through each of the holes 70a is observed by the camera 40 and compared with a target position of the laser beam. Next, a degree of an error in the irradiation position of a laser beam is recognized and a path along which the laser beam is irradiated is corrected.

However, in the conventional method, since the laser beam passing through the holes 70a is observed through a glass portion 42 in front of the camera 40, a laser beam inclined with respect to the holes 70a, as indicated by a dotted line of FIG. 5, is refracted by the glass portion 42 of the camera 40. Thus, an accurate position on the plate 70 where the laser beam is irradiated is difficult to recognize and it takes some time for the camera 40 to move above the holes 70a to be measured. Also, the plate 70 may be damaged by power of the laser beam.

SUMMARY OF THE INVENTION

To solve the above and/or other problems, the present invention provides an apparatus and method of calibrating the marking position of chip scale marker by radiating a laser beam onto a screen corresponding to a wafer by reducing power density of the laser beam in use by using a pinhole apparatus and measuring the irradiated laser beam.

According to an aspect of the present invention, a chip scale marker including a laser system, a wafer holder supporting a wafer to be processed, and a camera moving above the wafer holder by being connected to an X-Y stage and monitoring the wafer supported on a center hole of the wafer holder, the chip scale marker comprising a unit detachably arranged on a laser beam path from the laser system and reducing power density of a laser beam; and a screen arranged on a center hole of the wafer holder and indicating a position where a laser beam from the laser system is irradiated.

The laser beam power density reducing unit is a pinhole apparatus having a pinhole having a predetermined diameter. The chip scale marker further comprises an ND filter reducing the quantity of the laser beam at a predetermined rate.

The pinhole apparatus is manufactured of invar or diamond. The pinhole apparatus has a convex surface in a direction in which the laser beam is input. In the pinhole apparatus, the diameter of the pinhole increases along the laser beam path.

The screen comprises a lower layer absorbing the irradiated laser beam and an upper layer transmitting the light from the lower layer upward in a vertical direction.

The screen comprises a lower layer made of glass or acryl whose surfaces are roughly processed to disperse light at a point where the laser beam is irradiated and an optical attenuator arranged above the lower layer to provide a single point upward by filtering the dispersed light.

The screen is a semi-transmissive glass or paper.

The wafer holder further comprises a plurality of holes formed on a concentric circle separated a predetermined distance from the center hole of the wafer holder and a semi-transmissive film provided on the holes.

A chip scale marker including a laser system, a wafer holder supporting a wafer to be processed, and a camera moving above the wafer holder by being connected to an X-Y stage and monitoring the wafer supported on the wafer holder, the chip scale marker comprising a unit detachably arranged on a laser beam path from the laser system and reducing power density of a laser beam; a camera screen arranged in front of the camera; and a unit installing and removing the camera screen at and from a front side of the camera.

The camera screen installing and removing unit is a unit rotating the camera screen.

The camera screen is a paper roller supported by two support shafts so that, as a first support shaft rotates, paper wound around a second support shaft is released to be wound around the first support shaft.

The camera screen installing and removing unit reciprocates the camera screen in a direction along the support shafts.

According to another aspect of the present invention, a method of calibrating a marking position of a chip scale marker including a laser system, a wafer holder supporting a wafer to be processed, a camera moving above the wafer holder by being connected to an X-Y stage and monitoring the wafer supported on the wafer holder, a unit detachably arranged on a laser beam path from the laser system and reducing power density of a laser beam, and a screen arranged on a center hole of the wafer holder and indicating a position where a laser beam from the laser system is irradiated, the method comprising the steps of radiating a laser beam using the laser system to a target position on the screen; measuring a position of the laser beam irradiated to the screen; and calibrating the laser system by comparing the measured position of the laser beam and a target position, wherein the screen is made of paper, and the position of the laser beam is a position where the screen is changed black by the laser beam irradiated by the laser system whose power density is reduced by the laser beam power density reducing unit.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
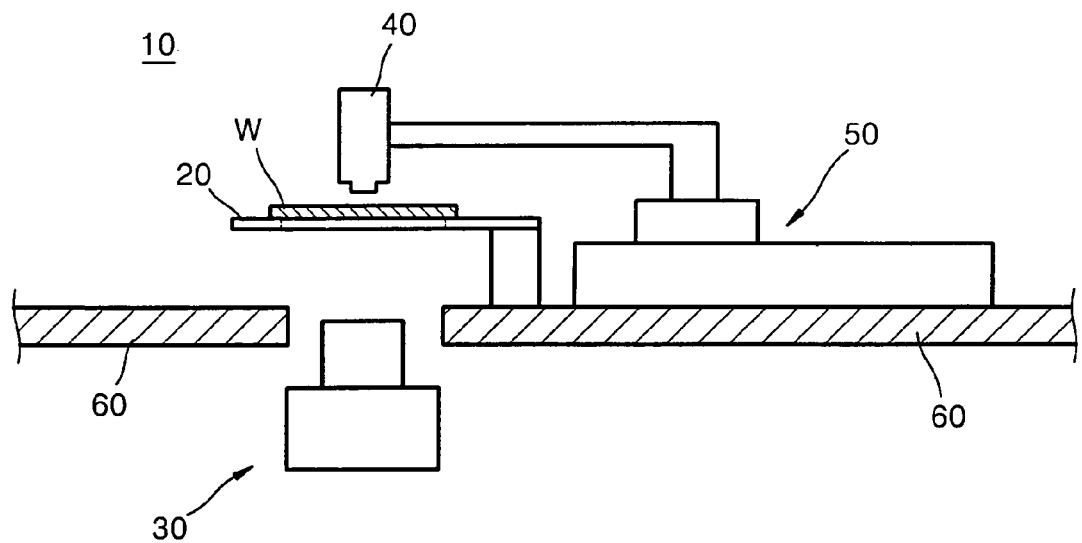
FIG. 1 is a view illustrating a constitution of a typical chip scale marker.
Figure 2:
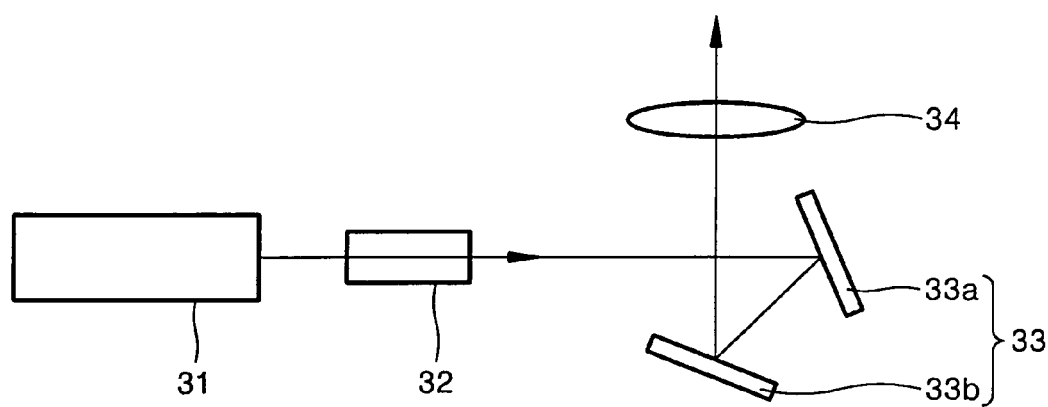
FIG. 2 is a view illustrating a constitution of the laser system of FIG. 1.
Figure 3:
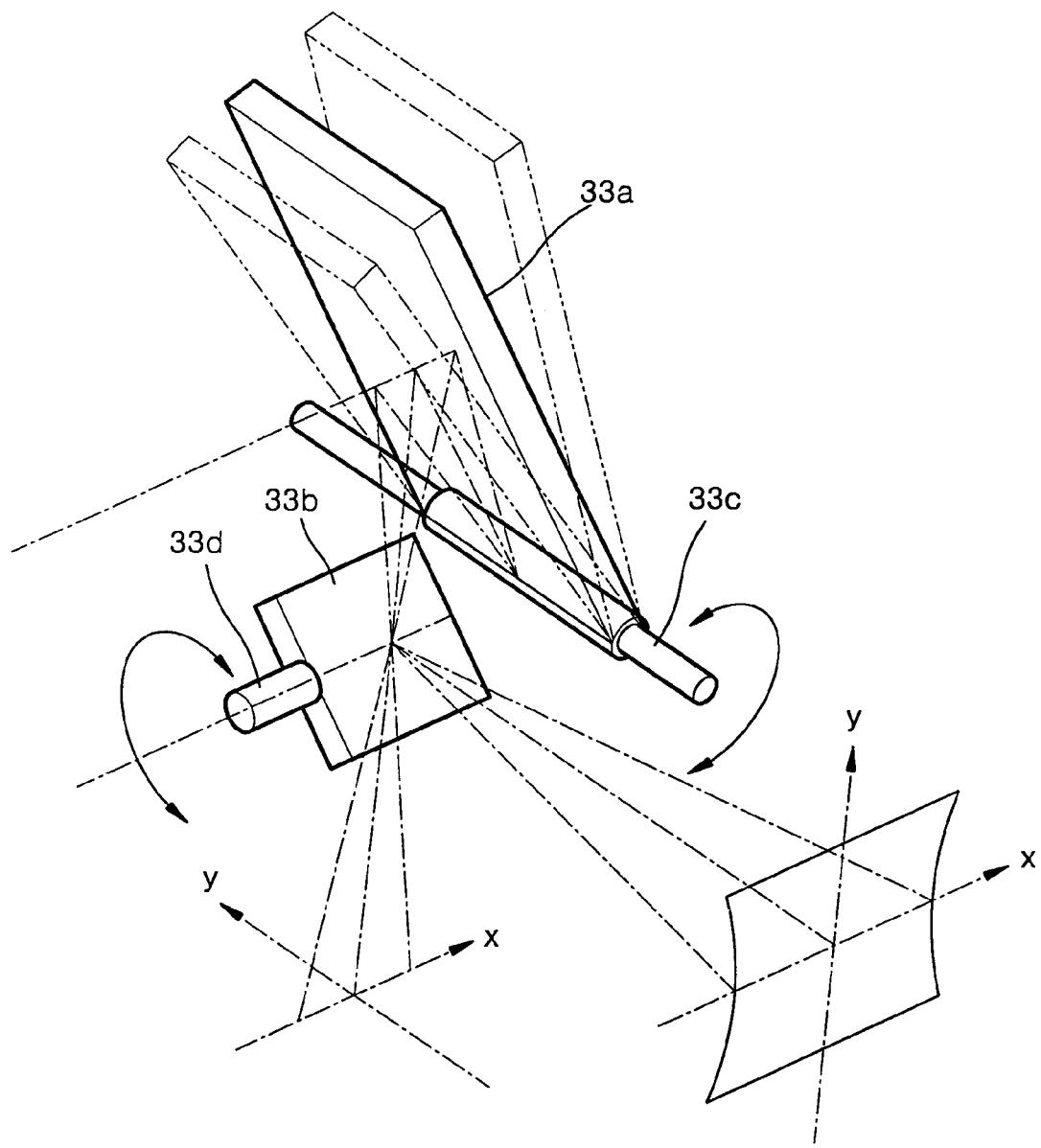
FIG. 3 is a view illustrating that a marking shape is distorted by the Galvano scanner.
Figure 4A:
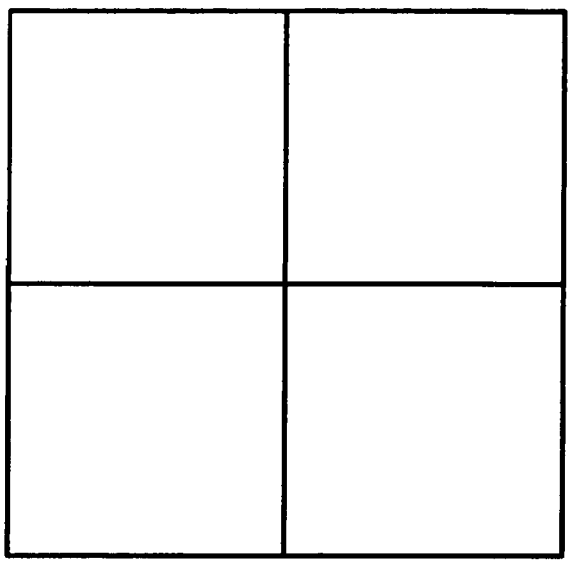
FIGS. 4A and 4B are views illustrating a pin cushion distortion phenomenon.
Figure 4B:
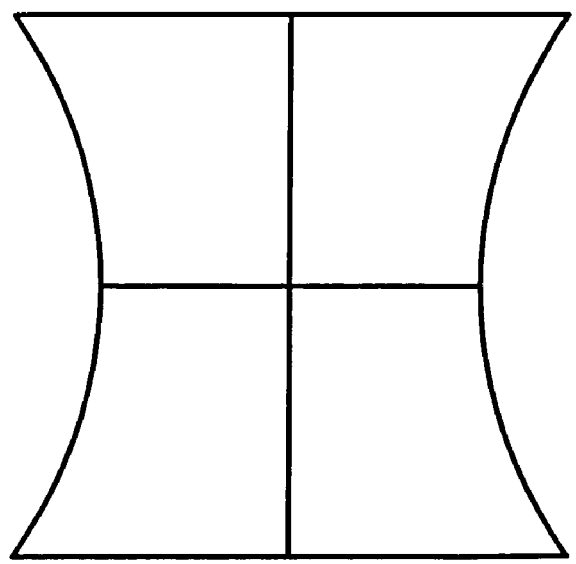
Figure 5:
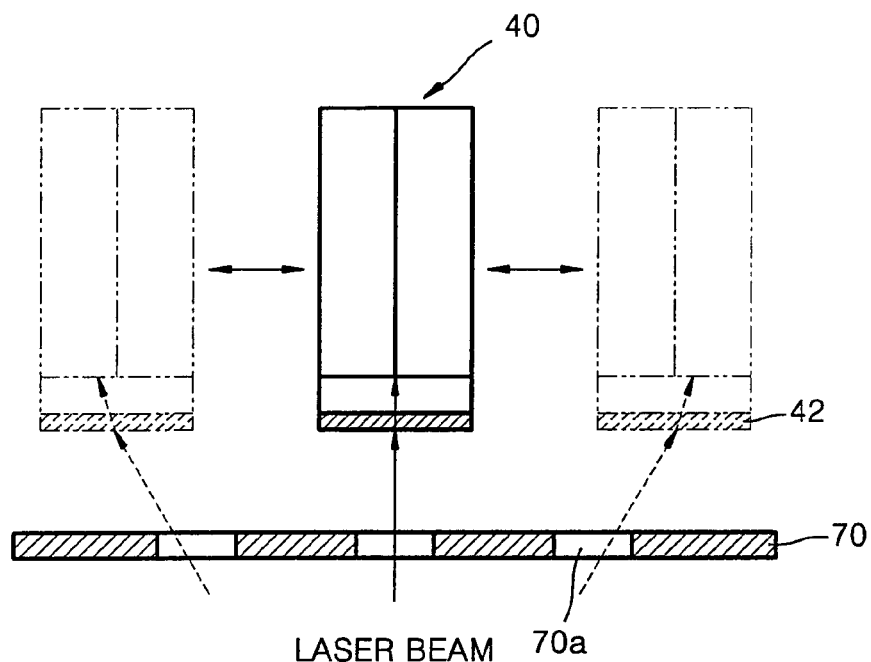
FIG. 5 is a view illustrating a conventional method of measuring a marking error.

A chip scale marker according to a first preferred embodiment of the present invention will now be described with reference to the accompanying drawings. In the drawings, thicknesses of layers or areas shown in the drawings are exaggerated for the convenience of explanation.

Figure 6:
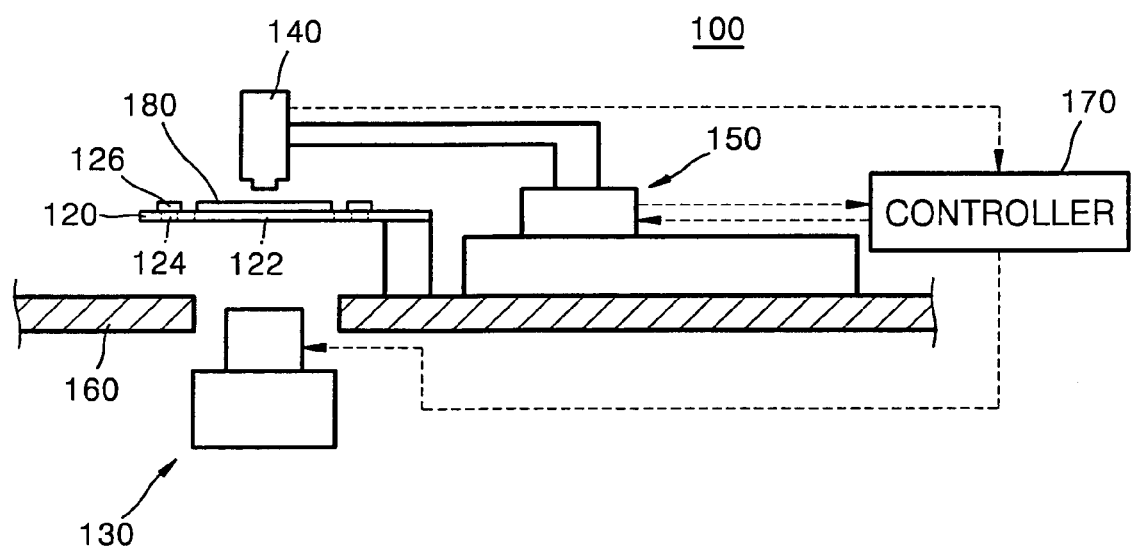
FIG. 6 is a view illustrating a chip scale marker according to a first preferred embodiment of the present invention.
Figure 7:
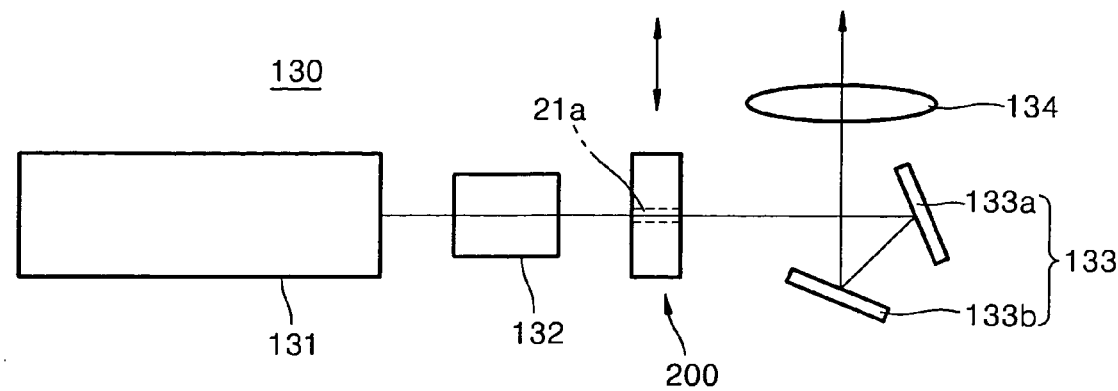
FIG. 7 is a view illustrating a constitution of the laser system of FIG. 6.

FIG. 6 is a view illustrating a chip scale marker according to a first preferred embodiment of the present invention. FIG. 7 is a view showing a constitution of the laser system of FIG. 6.

Referring to FIGS. 6 and 7, a screen 180 is placed on a wafer holder and a laser system 130 is arranged under the wafer holder 120. A laser beam oscillated by a laser oscillator 131 of the laser system 130 is magnified by a beam expander 132 and input to a pinhole apparatus 200. Of the laser beam input to the pinhole apparatus 200, only a laser beam corresponding to a diameter of a pinhole 210a passes through the pinhole 210a to be diffracted. The diffracted laser beam passes through a Galvano scanner 133 and an f-θ lens 134 and is irradiated onto the screen 180. The pinhole apparatus 200 limits a diameter through which the laser beam passes and diffracts the laser beam having passed the pinhole 210a so that power density of a laser beam irradiated to a target point is reduced.

Figure 8:
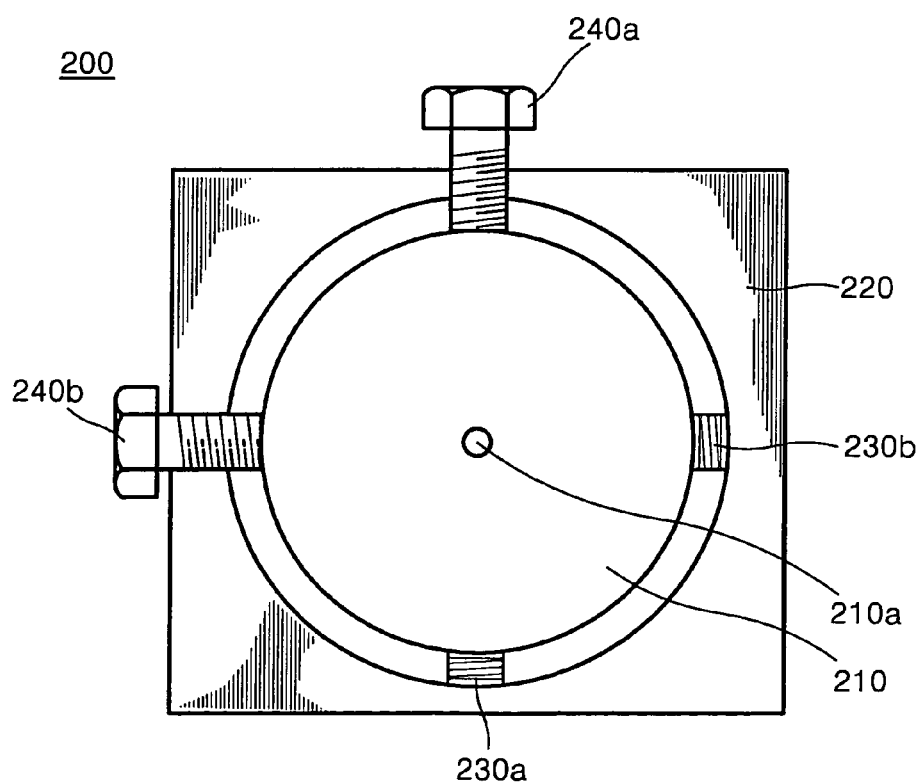
FIG. 8 is a view illustrating the pinhole apparatus of FIG. 6.
Figure 9:
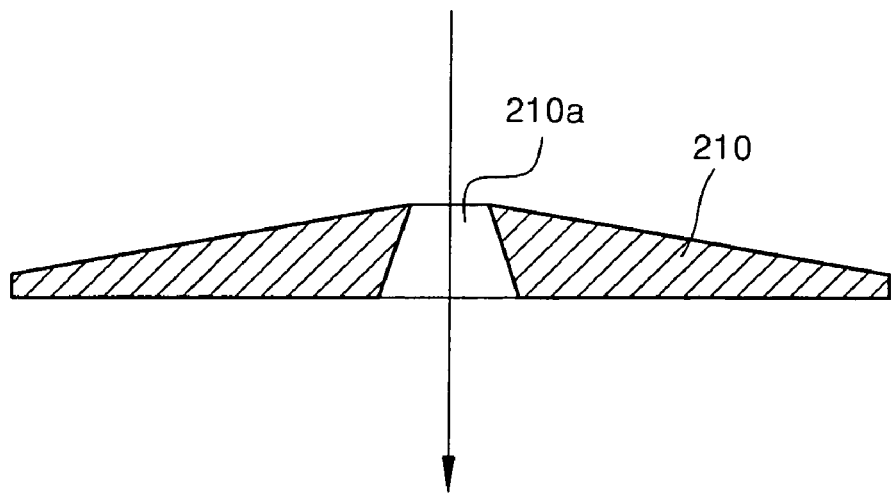
FIG. 9 is a sectional view illustrating a pinhole block of FIG. 8.

FIG. 8 shows a constitution of the pinhole apparatus of FIG. 6. FIG. 9 is a sectional view illustrating a pinhole block of the pinhole apparatus of FIG. 8. A pinhole block 210 where the pinhole 210a having a predetermined diameter is formed is disposed at the center of the pinhole apparatus 200. A pinhole frame 220 separated a predetermined distance from the pinhole block 210 is disposed around the pinhole block 210. The pinhole lock 210 is elastically biased by springs 230a and 230b in vertical and horizontal directions in the pinhole frame 220. Adjustment screws 240a and 240b supporting the pinhole block 210 are installed opposite to the springs 230a and 230b, respectively. The screws 240a and 240b adjust the position of the pinhole block 210 in the pinhole frame 220 in the vertical and horizontal directions so that a proceeding axis of a laser beam is aligned to the pinhole 210a. The pinhole apparatus 200 is preferably configured such that it is attached on a laser beam path during calibrating a marking position and detached from the laser beam path during wafer marking by an attaching and detaching means.

Equation 1 represents the strength of a laser beam passing through the pinhole 210a. It can be seen that, as the diameter of the pinhole 210a decreases, the strength of the laser beam passing through the pinhole 210a decreases.

$$P(r) = P(\infty) \times \left[1 - \exp\left(-2 \times \frac{r^2}{R^2}\right)\right] \quad \text{[Equation 1]}$$

Here, "P(r)" denotes the strength of a laser beam passing through the pinhole 210a, "P(∞)" denotes the strength of a laser beam incident on the pinhole 210a, "R" denotes the radius of a laser beam incident on the pinhole 210a, and "r" denotes the radius of the pinhole 210a.

The pinhole apparatus 200 where the laser beam directly contacts is preferably manufactured of invar or diamond exhibiting less thermal deformation. Preferably, one side of the pinhole apparatus 200 is formed convex in a direction where the laser beam is input so that the laser beam irradiated onto the pinhole apparatus 200 is reflected and scattered outwardly. This is to prevent the reflected laser beam from proceeding back to the laser oscillating apparatus 131. Also, the diameter of the pinhole 210a preferably increases along the path of the laser beam to facilitate diffraction of the laser beam passing through the pinhole 210a and reduce power density of the laser beam.

The Galvano scanner 133 includes an x mirror 133a and a y mirror 133b. The x mirror 133a controls movement of a laser beam in a direction x by using an x drive (not shown) rotating a shaft (not shown) at one end of the x mirror 133a. The y drive (not shown) controls movement of a laser beam output from the x mirror 133a in a direction y.

A camera 140 observing the wafer or the screen 180 is installed above the wafer holder 120. The camera 140 is supported and moved by an X-Y stage 150. The camera 140 and the X-Y stage 150 transmit an electrical signal to a controller 170. The controller 170 controls the Galvano scanner 133 and the X-Y stage 150.

Figure 10:
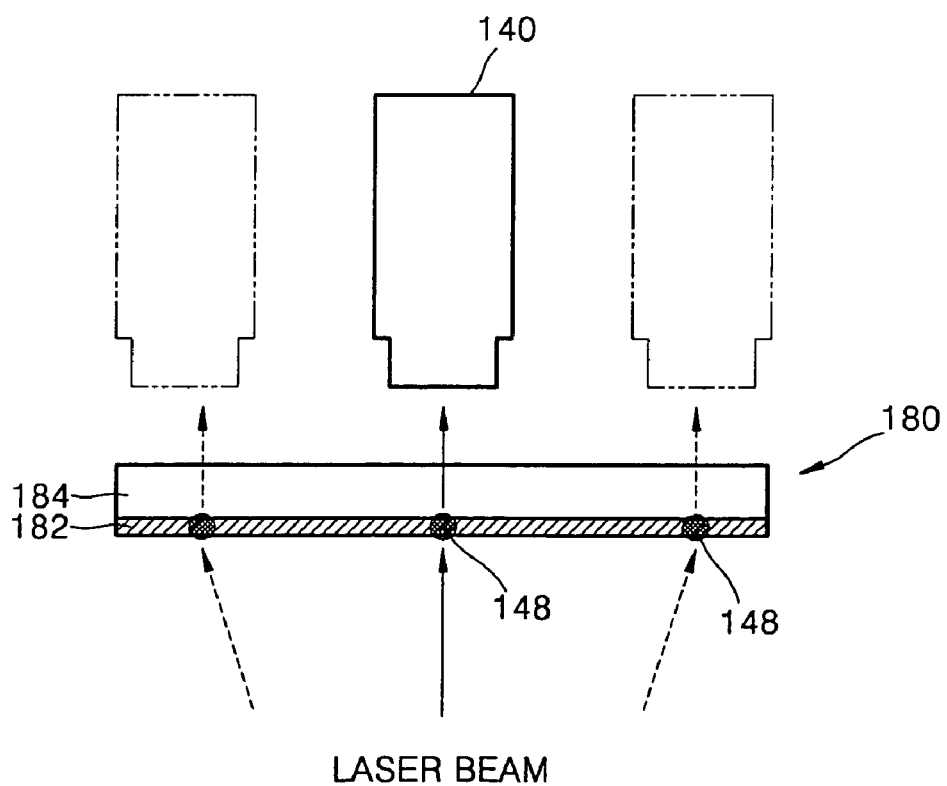
FIG. 10 is a view illustrating an optical path of a laser beam which is irradiated onto a screen.

The screen 180 has the same shape and size as those of the wafer to be marked and is formed of two layers as shown in FIG. 10. A lower layer 182 is a fluorescent layer which illuminates by absorbing a laser beam while an upper layer 184 is a layer which transmits the laser beam passing through the fluorescent layer. The lower layer 182 is placed at a center hole 122 of FIG. 11 of the wafer holder and preferably rigid to a degree so as not to be deformed.

Figure 11:
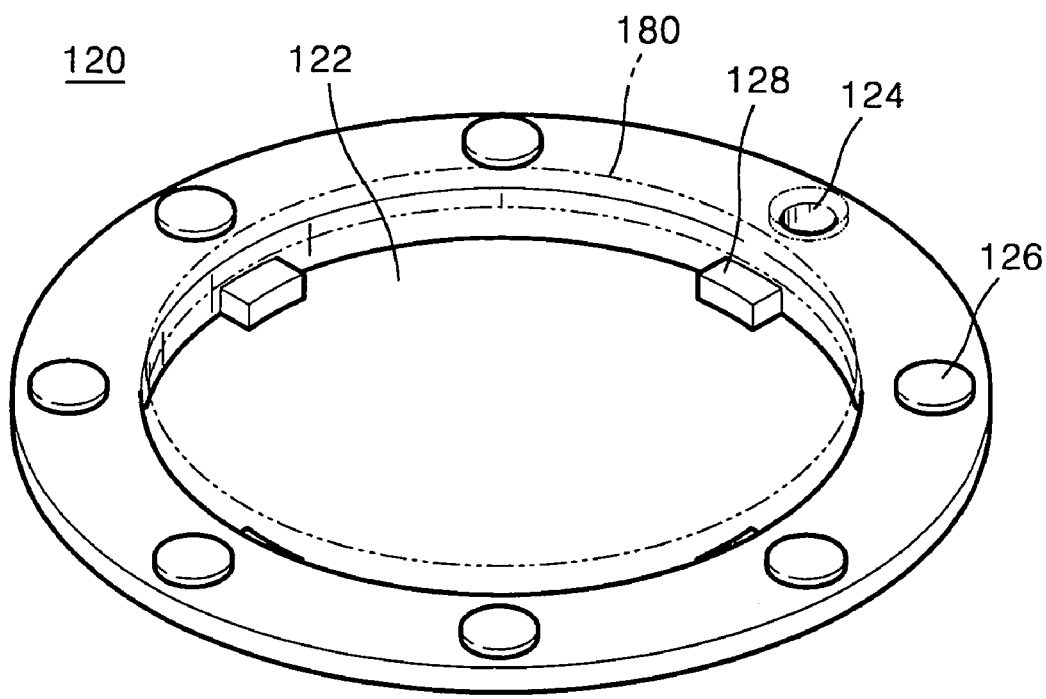
FIG. 11 is a perspective view illustrating the wafer holder of FIG. 6.

FIG. 11 is a perspective view illustrating the wafer holder of FIG. 6. A plurality of holes 124 are formed around the center hole 122 where the wafer is accommodated. A semi-transmissive film 126 semi-transmitting light is attached on the holes 124. The holes 124 are preferably arranged coaxially outside a center shaft of the center hole 122. The semi-transmissive film 126 has the same function as the screen 180.

The operation of the chip scale marker 100 having the above constitution is described below with reference to the accompanying drawings.

Figure 12:
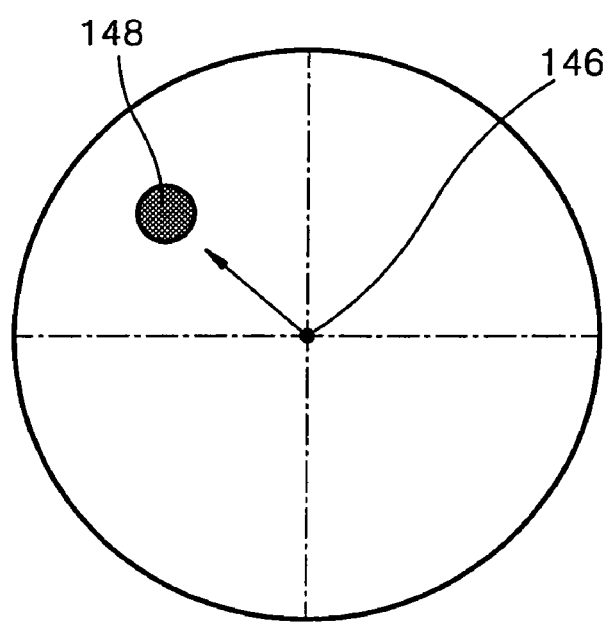
FIG. 12 is a view illustrating a center point of the camera and a laser beam point deviated therefrom.

FIG. 10 is a view illustrating an optical path of a laser beam which is irradiated onto the screen 180. FIG. 12 is a view illustrating a center point of the camera and a laser beam point deviated therefrom.

The screen 180 instead of the wafer is disposed on the wafer holder 120. When a laser beam is oscillated by the laser oscillator 131, the laser beam passes through the beam expander 132, the pinhole apparatus 200, the Galvano scanner 133, and the f-θ lens 134 to be irradiated onto a target position of the screen 180. The irradiated laser beam is absorbed by the lower layer 182 that is a fluorescent layer and a light emitted therefrom form a laser beam point 148 at the lower layer 182 and proceeds upward after passing through the upper layer 184 that is a transmittance layer. At this time, the light incident on the screen 180 to be inclined (the laser beam indicated by an imagery line of FIG. 10 proceeds vertically with respect to the camera 140 disposed thereabove along an optical path indicated by a dotted line in FIG. 10. The laser preferably used a Nd:YAG laser and a visible ray which is a green light having a 532 nm wavelength that is a second harmonic wave. Also, the camera 140 preferably uses a vision CCD camera capable of recognizing the laser beam in use.

The camera 140 which is moved by the X-Y stage 150 to be disposed above a target point 146 of the laser beam reads the laser beam point 148 formed on the screen 180 under the camera 140. The camera 140 recognizes a deviation of the beam point 148 from the center point 146 of the camera 140 and inputs the X-Y coordinate of the deviation to the controller 170. The beam point confirmation process is performed by repeating the above-described step at a plurality of positions corresponding to the positions of the chips.

The controller 170 analyzes the input positional information and controls the mirrors of the Galvano scanner 132 so that a light beam is irradiated on the position of a wafer chip. Next, after the screen 180 is removed, the wafer is installed on the wafer holder 120. The position where the wafer is installed is the same as the position where the screen 180 is placed. The laser beam oscillated by the laser 130 is irradiated to a corrected position on the wafer to perform marking.

When a movement of the Galvano scanner 132 during laser marking is to be detected, a laser beam is irradiated on the semi-transmissive film 126 on the hole 124 of the wafer holder 120 and the camera 140 is moved upward from the target point where the laser beam is to be irradiated so that a beam point irradiated in the above-described method is detected and the laser beam is calibrated.

In the above preferred embodiment, the pinhole apparatus 200 which is detachable is used to reduce the power density of the laser beam. However, a neutral density filter (ND filter) having light transmittance of 10–50%, for example, is used instead of the pinhole apparatus 200, or the pinhole apparatus 200 and the ND filter can be used together.

In a modification of the screen, glass or acryl where a surface to which a laser beam is irradiated is roughly processed is arranged at the lower layer and an optical attenuator is arranged above the glass or acryl. When a laser beam is irradiated on the screen, the laser beam is dispersed on the roughly processed surface of the lower layer. The laser beam irradiated at an angle is dispersed so as not to be transmitted in an inclined direction. The irradiated laser beam forms an image on the lower layer. The optical attenuator classifies the point to which the laser beam is irradiated among the dispersed light in the lower layer. Since the light passing through the optical attenuator displays one beam point, the beam point can be easily observed by using the camera 140.

Figure 13:
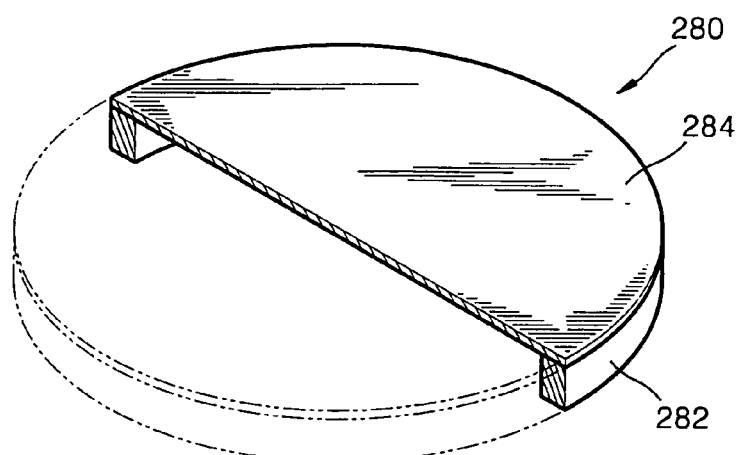
FIG. 13 is a partially cut-away perspective view illustrating a modified example of the screen.

FIG. 13 shows a screen according to another preferred embodiment of the present invention. A semi-transmissive sheet 284 is attached to a circular frame 282 having the same size as the wafer. For example, a semi-transmissive paper, can be used for the semi-transmissive sheet 284. The semi-transmissive sheet 284 displays a point made by a color laser beam to indicate the position of the laser beam. Also, although a two-layered screen is used in the above-described preferred embodiment, when a hard and semi-transmissive material like semi-transmissive glass is to be used, a one-layer screen can be used.

In the above preferred embodiment, the beam point of the screen is measured with the CCD camera by using a laser beam having the wavelength of a visible ray. When a laser beam having the wavelength of an infrared ray or an ultraviolet ray, not the wavelength of a visible ray, a paper screen is used as the screen to detect the beam where the laser beam is irradiated. The beam point of the screen is changed black by slightly burning with properly lowered power density of the laser beam irradiated to the screen. The above method using the paper screen can be applied to a marking calibrating system using a laser beam having the wavelength of a visible ray.

Figure 14:
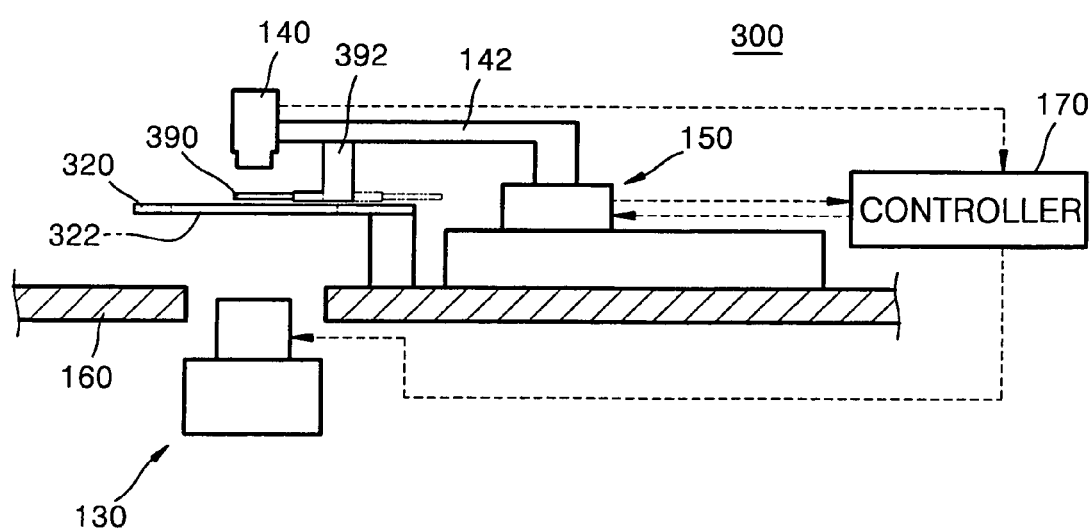
FIG. 14 is a view illustrating a chip scale marker according to a second preferred embodiment of the present invention.

FIG. 14 shows a marking position calibrating apparatus of a chip scale marker 300 according to a second preferred embodiment of the present invention. Here, the same constituent elements have the same reference numerals as those of the first preferred embodiment and detailed descriptions thereof will be omitted.

Referring to FIG. 14, a motor 392 to install and remove a camera screen 390 in front of the camera 140 is arranged on a support rod 142 supporting the camera 140. In FIG. 14, a case in which the camera screen 390 is installed in front of the camera 140 is indicated by a solid line while a case in which the camera screen 390 is removed from the front side of the camera 140 is indicated by a dotted line. The camera screen 390 is preferably arranged close to a wafer holder 320. A center hole 322 is formed at the center of the wafer holder 320 and a laser beam is irradiated from the laser system 130 through the center hole 322 to the camera screen 390. Any type of the screen applied to the above preferred embodiments can be applied to the camera screen 390.

When a marking position is to be detected by using the screen 390, the camera screen 390 is arranged in front of the camera 140 by driving a motor 392. Next, the camera 140 and the camera screen 390 are moved to predetermined positions by using the X-Y stage 150 to correspond to the position of the wafer where the laser beam is irradiated and the laser beam is irradiated to the camera screen 390. Then, a beam point formed on the camera screen 390 is observed by the camera 140 and the positional information of the beam point is input to the controller 170.

Figure 15:
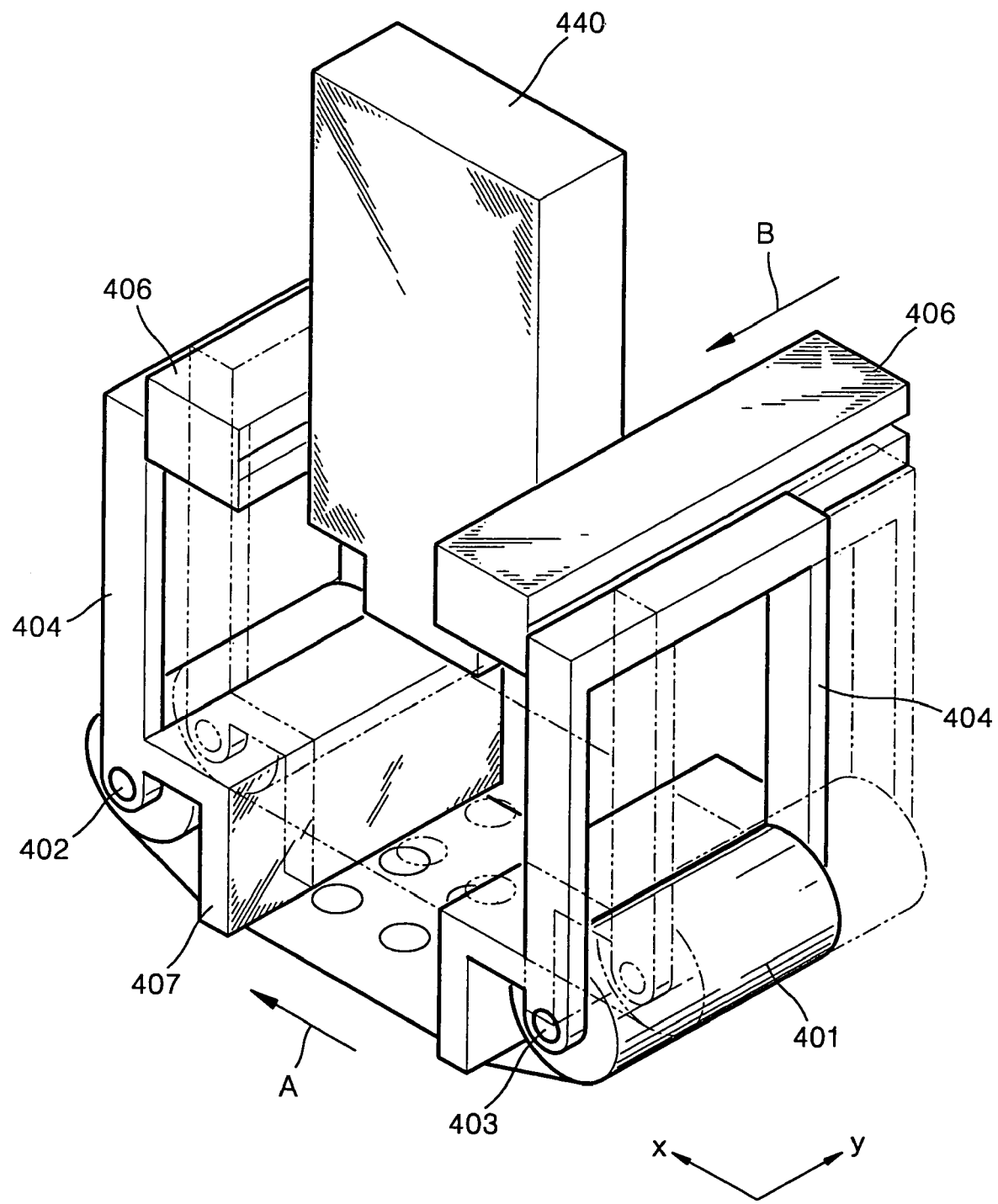
FIG. 15 is a perspective view illustrating a modified example of the paper screen.

FIG. 15 is a perspective view illustrating an example of using a paper screen by installing the same in front of the camera. Referring to FIG. 15, a paper roller 401 used as a paper screen is supported by being wound around first and second support shafts 402 and 403 and separated a predetermined distance from the camera 440. A horizontal surface of the paper roller 401 to which a laser beam is irradiated is preferably arranged close to the marking surface of the wafer loaded on the wafer holder. As the first support shaft 402 is rotated, paper wound around the second shaft 403 is released and wound around the first support shaft 402. The first and second support shafts 402 and 403 are installed at the camera 440 via a connection member 404 to be capable of sliding in a direction perpendicular to a direction in which the paper is supplied, which is indicated by an arrow A. A guide member 406 guiding sliding of the connection member 404 with respect to the camera 440 is arranged between the camera 440 and the connection member 404. Reference numeral 407 is a portion extending from the connection member 404 toward the inner side of the paper roller 401 so that the marking surface of the paper screen makes a plane perpendicular to the direction of the laser beam of the laser system 130.

During calibration of the marking position of the chip scale marker, the connection member 404 including the paper roller 401 is moved above the wafer holder along the guide member 406 so that the camera 440 including the paper roller 401 performs a marking job. While the connection member 404 is moved in a direction indicated by an arrow B, the paper roller 401 is located at a position where a field of view of the camera exists. The paper roller 401, that is, a paper screen, is located in the field of view of the camera as being moved along n the X axis while wound around the first support shaft 402 and the position on the Y axis is adjusted along the guide member 406. Next, a laser beam is irradiated onto the paper screen in the above method to change the paper screen black. Then, the camera 440 measures the black point to calculate deviation from a target point.

As described above, according to the chip scale marker and method of calibrating a marking position according to the present invention, the direction of laser beam can be calibrated by measuring the position marked on a wafer chip before wafer marking. Also, during marking, a simple adjustment of a laser beam can be made by radiating a laser beam to a semi-transmissive film formed at the edge of the wafer holder and measuring a point of the laser beam. Furthermore, since calibration is performed with respect to the laser beam point on the screen, the calibration is accurate so that marking can be made at an accurate position on the wafer chip. The method of calibrating a marking position which checks the marking position by changing the paper screen black can be applied to a chip scale marker using the wavelength of an ultraviolet ray or an infrared ray in addition to a chip scale marker using the wavelength of a visible ray.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of calibrating a marking position of a chip scale marker including a laser system for emitting a laser beam, a wafer holder having a hole and adapted to support, over the hole, a wafer to be processed, a camera connected to an X-Y stage for translating the camera over and across the wafer holder and operative to monitor the wafer supported on the wafer holder, a laser beam power density reducing unit removably arranged on the optical path of the laser beam to reduce the power density of the laser beam during calibration, the method comprising the steps of:

provAiding a screen that has a front and a rear surface and operative to generate, on the front surface, a beam point when a laser beam is directed onto the rear surface, the beam point corresponding to the location where the laser beam intersects the rear surface mounting the screen over the hole of the wafer holder;

directing the laser beams using the laser system, through the hole onto the rear surface of the screen so as to form a beam point on the front surface of the screen;

capturing an image of the beam point by use of the camera, the camera including a reference image point;

measuring the deviation of the captured image of the beam point from the reference image point; and calibrating the laser system based on the measured deviation.

2. The method as claimed in claim 1, wherein the laser beam power density reducing unit includes a pinhole that has a predetermined diameter for allowing a portion of the laser beam to pass therethrough, thereby reducing the power density of the laser beam.

3. The method as claimed in claim 2, wherein the laser beam power density reducing unit further comprises a neutral density filter.

4. The method as claimed in claim 1, wherein the laser beam power density reducing unit includes a neutral density filter.

5. The method as claimed in claim 1, wherein the screen is made of paper and the beam point is generated by charring a portion of the paper with the laser beam.

6. A method of calibrating a marking position of a chip scale marker including a laser system for emitting a laser beam, a wafer holder for supporting a wafer thereon, and an optical sensing device for monitoring the wafer, the method comprising:
- (a) providing a screen that includes a front and a rear surface and is operative to generate, on the front surface, a beam point when a laser beam is directed onto the rear surface, the beam point corresponding to the location where the laser beam intersects the rear surface;
- (b) mounting the screen on the wafer holder in place of the wafer;
- (c) directing the laser beam to the rear surface of the screen by use of the laser system so as to form a beam point on the front surface of the screen;
- (d) positioning the optical sensing device over the front surface of the screen by use of a translation mechanism;
- (e) capturing an image of the beam point by use of the optical sensing device, the optical sensing device having a reference image point;
- (f) calculating the deviation of the captured image of the beam point from the reference image point; and
- (g) calibrating the laser system based on the calculated deviation.

7. A method of calibrating a marking position of a chip scale marker as recited in claim 6, wherein the optical sensing device is a CCD (charge coupled device) camera.

8. A method of calibrating a marking position of a chip scale marker as recited in claim 6, further including, prior to the step of directing a laser beam: reducing the power density of the laser beam by positioning at least one of a neutral density filter and a pin hole on the optical path of the laser beam.

9. A method of calibrating a marking position of a chip scale marker as recited in claim 6, wherein the screen is made of a paper and wherein the beam point is generated by charring a portion of the paper with the laser beam.

10. A method of calibrating a marking position of a chip scale marker as recited in claim 6, further comprising:
repeating the steps (c)–(g) at different locations of the beam point.

11. The method as claimed in claim 9, wherein the laser beam has a wavelength invisible to the camera.

12. A method of calibrating a marking position of a chip scale marker as recited in claim 6, wherein the screen includes a lower fluorescent layer and an upper transmissive layer and wherein the step of directing the laser beam to the rear surface of the screen includes:
- causing the lower fluorescent layer to absorb the energy of the laser beam and to generate fluorescent light; and
- causing the upper transmissive layer to transmit the fluorescent light so as to form the beam point directly above the location where the laser beam intersects the lower fluorescent layer.

13. A method of calibrating a marking position of a chip scale marker as recited in claim 6, wherein the screen includes a lower layer and an upper layer, the lower layer having a roughly processed surface facing opposite the upper layer, and wherein the step of directing the laser beam to the rear surface of the screen includes:
- causing the roughly processed surface to disperse the laser beam; and
- causing the upper layer to attenuate the dispersed laser beam and thereby to differentiate the beam point from the dispersed laser beam.

14. A method of calibrating a marking position of a chip scale marker as recited in claim 13, wherein the lower layer is made of a material selected from the group consisting of glass and acrylic.

15. A method of calibrating a marking position of a chip scale marker as recited in claim 6, wherein the screen is made of semi-transmissive glass.

* * * * *